United States Patent [19]

Morinaga et al.

[11] Patent Number: 4,559,166

[45] Date of Patent: Dec. 17, 1985

[54] ELECTRICALLY CONDUCTIVE COMPOSITION

[75] Inventors: Hiroshi Morinaga, Yotsukaido; Satoru Miyake, Ichihara; Terumi Sato, Ichihara, all of Japan

[73] Assignee: Nissan Chemical Industries Ltd., Tokyo, Japan

[21] Appl. No.: 675,215

[22] Filed: Nov. 27, 1984

[30] Foreign Application Priority Data

Nov. 30, 1983 [JP] Japan ............................ 58-226622
Nov. 30, 1983 [JP] Japan ............................ 58-226623
Nov. 30, 1983 [JP] Japan ............................ 58-226624

[51] Int. Cl.$^4$ ............................................. H01B 1/06
[52] U.S. Cl. ................................ 252/512; 252/500; 252/510; 252/511; 524/439
[58] Field of Search ............... 252/512, 500, 510, 511; 524/439

[56] References Cited

U.S. PATENT DOCUMENTS 4,403,232  9/1983  Kropac ........................... 428/480

Primary Examiner—Paul Lieberman
Assistant Examiner—Robert A. Wax
Attorney, Agent, or Firm—Oblon, Fisher, Spivak, McClelland & Maier

[57] ABSTRACT

An electrically conductive composition comprising 100 parts by weight of a copper powder, from 2 to 100 parts by weight of a resin binder, and from 0.1 to 30 parts by weight of an additive agent, wherein the additive agent is at least one compound selected from the group consisting of α-ketols, aliphatic and aromatic thiols, thiodiarylamines, tall oils, rosins, rosin esters, higher fatty acid amides, o-aminophenols, 2,2'-dipyridyls, and 2,2'-diquinolyls.

15 Claims, No Drawings

ELECTRICALLY CONDUCTIVE COMPOSITION

The present invention relates to an electrically conductive composition. More particularly, it relates to an electrically conductive composition containing a copper powder as an electrically conductive material, wherein a certain organic compound is incorporated to obtain improved electric conductivity.

Heretofore, coating compositions or adhesives containing silver as conductive material have been widely used for various electronic components and electrodes for printed circuit boards, or as a conductive pattern-forming material or as a bonding material. Silver is preferably used as the conductive material because it has the highest electric conductivity among metals, and it has high chemical stability as compared with a base metal such as copper. However, silver is very expensive. Further, due to the migration of silver, there are certain restrictions for the design of the products, and there will be some problems on the dependability depending upon the particular conditions for use.

Accordingly, it has been desired to develop, as a substitute, an electrically conductive composition using an inexpensive copper powder as the base material. The most serious difficulty in this case is that the copper powder dispersed in a binder is highly susceptible to oxidation. Accordingly, during the storage as the composition, during the formation of a coating or during its use, the copper powder is likely to be oxidized at its surface, and the contact resistance among the powder particles tends to increase, whereby no adequate electric conductivity will be obtained and the maintenance of the conductivity will be difficult. Under circumstances, there have been many attempts to impart good conductivity by adding various additives to the copper-containing composition and to maintain the conductivity as long as possible. For instance, it has been proposed to incorporate phosphorous acid or its derivatives (Japanese Examined Patent Publication No. 24936/1977), anthracene or its derivatives (Japanese Unexamined Patent Publication No. 103260/1981) and hydroquinone derivatives (Japanese Unexamined Patent Publication No. 55974/1982). However, most of these conventional compositions have certain difficulties in one way or another. Namely, some of them are likely to cause so-called skinning i.e. a phenomenon in which the surface of the compositions hardens whereby the quality of the compositions will be impaired, and thus have a difficulty in the storage stability. In some of them, the specific electric resistance is at a level of $10^{-3}$ $\Omega$cm at best, when produced in the form of e.g. a coating film, and thus is not adequate as compared with the silver-containing conductive composition. Further, in some of them, when a product is kept under a high temperature and high humidity condition for a long period of time, green rust will form on the surface of the product, whereby the electric conductivity will substantially decrease. Thus, most of the additives used in the conventional copper-containing conductive compositions are not fully satisfactory for practical use.

Accordingly, it is an object of the present invention to overcome such difficulties inherent to the prior art, and to provide a copper-containing conductive composition which has good storage stability and excellent electric conductivity and which is free from bringing about defects in the outer appearance such as rusts on the surface of the product.

The present inventors have found it extremely effective for the above object to incorporate a certain specific organic compound as an additive agent to a composition system comprising a copper powder and a resin binder as major components. The present invention has been accomplished based on this discovery.

Namely, the present invention provides an electrically conductive composition comprising 100 parts by weight of a copper powder, from 2 to 100 parts by weight of a resin binder, and from 0.1 to 30 parts by weight of an additive agent, wherein the additive agent is at least one compound selected from the group consisting of $\alpha$-ketols, aliphatic and aromatic thiols, thiodiarylamines, tall oils, rosins, rosin esters, higher fatty acid amides, o-aminophenols, 2,2'-dipyridyls, and 2,2'-diquinolyls.

Now, the present invention will be described in detail with reference to the preferred embodiments.

As the copper powder to be used for the composition of the present invention, there may be employed a reduced copper powder obtained by the reduction of e.g. copper oxide, an electrolytic copper powder or an atomized copper powder obtained by atomizing metal copper. The shape of the copper powder is not critical, and the powder may take various shapes such as flake, dendrite or a spherical shape. These copper powders may be used alone or in combination as a mixture of two or more different kinds. The particle size of the copper powder is selected depended upon the particular purpose of the composition, and is usually at most 300 $\mu$m, preferably from 1 to 100 $\mu$m.

In the present invention, the resin binder is meant for a polymer in general which has a binding effect to maintain the composition in a desired configuration. Specifically, there may be mentioned vinyl resins such as a polystyrene, a polyacrylate, a polymethacrylate, a polydiallylphthalate or an unsaturated polyester resin, a polycarbonate, a polyallylsulfone, an alkyd resin, a phenol resin, a xylene resin, an amino resin, a polyurethane, cellulose, an epoxy resin, a polyimide, and a silicone resin. For the preparation of a composition of the present invention, these resins may be used in any appropriate form such as a solvent form as dissolved in an organic solvent, an aqueous system such as an emulsion or a liquid resin form.

The composition of the present invention is characterized in that it contains, as the third essential component, an additive agent selected from the group consisting of $\alpha$-ketols, aliphatic and aromatic thiols, thiodiarylamines, tall oils, rosins, rosin esters, higher fatty acid amides, o-aminophenols, 2,2'-dipyridyls, and 2,2'-diquinolyls.

Ketols are organic compounds having an alcoholic hydroxyl group and a ketonic carbonyl group in the same molecule, and include $\alpha$-ketols, $\beta$-ketols and $\gamma$-ketols. Among them, $\alpha$-ketols having a structural unit of

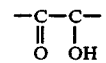

are suitable for the purpose of the present invention. Specifically, there may be mentioned, for instance, acetol, acetoin, dihydroxyacetone, phenacyl alcohol, benzoin, and ninhydrin.

The aliphatic or aromatic thiols are compounds represented by the general formula RSH where R is an alkyl group, a cycloalkyl group, an alkenyl group, a cycloalkenyl group, an aralkyl group or an allyl group. As specific examples of the aliphatic thiols, there may be mentioned n-propylmercaptan, n-butylmercaptan, allylmercaptan, octylmercaptan, laurylmercaptan, stearylmercaptan, oleylmercaptan, linolenylmercaptan, cyclohexylmercaptan and benzylmercaptan. As specific examples of the aromatic thiols, there may be mentioned thiophenol, 1-mercaptonaphthalene, 2-mercaptoanthracene, 3-mercaptophenanthrene, 4-mercaptobiphenyl and 2-mercaptopyridine. Further, as the aromatic thiols, there may be mentioned various derivatives of the above-mentioned compounds wherein the aromatic rings are substituted by an alkyl group, a hydroxyl group, a carboxyl group, a sulfone group, a nitro group or a halogen atom.

As specific examples of the thiodiarylamines, there may be mentioned thiodiphenylamine and thiodinaphthylamine.

The tall oils are recovered as by-products during the preparation of conifer kraft pulp, and contain resin acids composed mainly of abietic acid and its isomer, or an aliphatic acid such as oleic acid or linolic acid. The tall oils are dark brown oily substances, and usually comprise from 25 to 55% by weight of the resin acids and from 30 to 60% by weight of the fatty acids. They may be used for the purpose of the present invention without any particular restriction as to their composition.

The rosins include gum rosin obtained by distilling off turpentine oil from colophony collected directly from pine trees, wood rosin obtained by extracting a rosin component from pine root chips with a solvent, and tall rosin obtained by the precision distillation of crude tall oil. Such rosins contains from 80 to 97% by weight of a mixture of abietic acid and its isomer. Any one of such rosins may be used for the composition of the present invention. Further, there may also be employed a disproportionated rosin or a hydrogenated rosin obtained by heat treatment at a high temperature or hydrogenation treatment by means of a noble metal catalyst to eliminate the conjugated double bond, or a polymerized rosin obtained by heat treatment in the presence of an acidic catalyst.

Further, various rosin esters may be used as the additive agents for the composition of the present invention. The rosin esters are obtainable by reacting abietic acid and its isomer as the main components of rosin, with a monohydric or polyhydric alcohol at a high temperature. Specifically, there may be mentioned methyl-esterified rosin, monoethylene glycol-esterified rosin, diethylene glycol-esterified rosin, glycerin-esterified rosin or pentaerythritol-esterified rosin. Further, various modified rosins obtained by adding maleic anhydride, fumaric acid, acrylic acid or cyclopentadiene to the above-mentioned rosins and rosin esters by Diels-Alder reaction, or those further reacted with an alcohol, may also be used.

As the higher aliphatic acid amides, which may be used as the additive agents for the compositions of the present invention, amides derived from a higher aliphatic acid having from 10 to 24 carbon atoms are especially effective. Specifically, there may be mentioned lauric acid amide, myristicic acid amide, palmitic acid amide, stearic acid amide, oleic acid amide, linolic acid amide and brassidic acid amide.

Aminophenols include o-aminophenols, m-aminophenols and p-aminophenols. Among them, o-aminophenols exhibit excellent effects, whereas p-aminophenols are not effective.

Among various stereoisomers of dipyridyls and diquinolyls, 2,2'-dipyridyls and 2,2'-diquinolyls are most effective.

Further, various derivatives of o-aminophenols, 2,2'-dipyridyls and 2,2'-diquinolyls were found to have similar excellent effectiveness. For instance, there may be used their derivatives wherein the aromatic ring is substituted by an alkyl group, a nitro group or a halogen atom. For instance, as an o-aminophenol derivative, there may be mentioned 2-amino-4-methylphenol, 2-amino-4-nitrophenol or 2-amino-4-chlorophenol.

The above-mentioned various additive agents are respectively effective alone, but they may be used in combination as a mixture, if necessary. These compounds may be incorporated as they are. However, if necessary, they may be added as dissolved in a suitable organic solvent.

Now, the proportions of the respective components of the composition of the present invention will be described.

The composition of the present invention comprises 100 parts by weight of a copper powder, from 2 to 100 parts by weight, preferably from 7 to 45 parts by weight, of the resin binder and from 0.1 to 30 parts by weight, preferably from 0.5 to 10 parts by weight of the additive agent. If the amount of the additive agent is less than 0.1 part by weight relative to 100 parts by weight of the copper powder, the electric conductivity of the composition considerably decreases. On the other hand, if the amount of the additive agent exceeds 30 parts by weight relative to 100 parts by weight of the copper, no remarkable improvement in the effectiveness is observed, and the heat resistance or the humidity resistance tends to be poor.

To the composition of the present invention, there may be incorporated a solvent such as an aromatic compound, an ester, an ether, a ketone or an alcohol, a reactive diluent having a monofunctional group such as an alkyl glycidyl ether, or various polymerizable monomers such as vinyl monomers.

The composition of the present invention may be cured or dried to form a coating film or a shaped article by a conventional method for curing or drying a resin binder. The temperature for curing or drying the composition of the present invention varies depending upon the type of the resin binder and additive agents and the intended purpose of the composition, but is usually within a temperature range of from room temperature to 350° C., preferably from 50° to 250° C. For the curing or drying of the composition of the present invention, there may be employed a method in which the composition is coated or printed on e.g. a film or sheet of a polyester or polyallyl sulfone resin, a phenol resin-laminated board, an epoxy resin-laminated board, or a polyimide film, followed by curing or drying, or a method wherein the composition is poured into a mold and cured therein.

The composition of the present invention has excellent storage stability and is readily applicable to a paint, a printing ink, an adhesive or a shaped article such as a sheet. The product has excellent electric conductivity, and thus is useful for various industrial fields including electric and electronic fields, for instance, as an electrically conductive paint for electric circuits in printed circuit boards, jumpers and through-holes, and as an adhesive for electronic parts.

Now, the present invention will be described in detail with reference to Examples. However, it should be understood that the present invention is by no means restricted to these specific Examples.

In the Examples, "parts" and "%" represent "parts by weight" and "% by weight".

EXAMPLE 1

26 parts of electrolytic copper powder having an average particle size of 10 μm was thoroughly mixed with and dispersed in 8 parts of an epoxy-melamine resin varnish (solid concentration: 50%), 1.5 parts of benzoin and 4 parts of butylcarbitol. The coating composition thus obtained was screen-printed on a phenol resin substrate in a zig-zag pattern with a width of 2 mm, length of 368 mm and thickness of 60 μm. Then, the printed composition was heat-cured at 160° C. for 30 minutes. Then, the resistance of the coating film thus obtained was measured, and the length, the width and the thickness of the coating film were further measured, whereupon a specific resistance was calculated.

The resistance and specific resistance were 10.6Ω and $3.0 \times 10^{-4}$ Ωcm, respectively. The coating composition thus obtained was stored for 1 month at a temperature of about 10° C., whereupon no skinning was observed on the surface of the coating composition.

Further, the above-mentioned cured film was left in a constant temperature and humidity chamber at 60° C. under a relative humidity of 95% for 200 hours, whereupon no change was observed in the outer appearance of the coating film.

COMPARATIVE EXAMPLE 1

A copper-containing composition was prepared in the same manner as in Example 1 except that 1.5 parts of phosphorous acid was used instead of benzoin, and the composition was evaluated and tested.

The specific resistance of the cured coating film was $8.0 \times 10^{-3}$ Ωcm.

When the composition was stored under the same conditions as in Example 1, skinning was observed upon expiration of 1 day.

Further, when the cured coating film was left in a constant temperature and humidity chamber at 60° C. under a relative humidity of 95% for 200 hours, bluish white spots formed.

COMPARATIVE EXAMPLE 2

A copper-containing composition was prepared in the same manner as in Example 1 except that 0.34 part of anthracene was used instead of benzoin, and the composition was evaluated and tested.

The specific resistance of the cured coating film was $2.0 \times 10^{-3}$ Ωcm.

Further, a copper-containing composition was prepared in the same manner as above except that anthracene-9-carboxylic acid was used instead of anthracene. The specific resistance was $1.7 \times 10^{-3}$ Ωcm, i.e. substantially the same as in the case of anthracene.

However, upon expiration of 2 days, skinning was observed.

COMPARATIVE EXAMPLE 3

A copper-containing composition was prepared in the same manner as in Example 1 except that pyrocatechol was used instead of benzoin, and the composition was evaluated and tested.

The specific resistance of the cured coating film was $1.2 \times 10^{-3}$ Ωcm.

When this composition was stored under the same conditions as in Example 1, blackish brown skinning was observed after expiration of 1 day.

EXAMPLES 2 to 5

Copper-containing compositions were prepared in the same manner as in Example 1 except that benzoin in Example 1 was replaced by the respective ketols identified in Table 1. The compositions were evaluated. The results are shown in Table 1.

EXAMPLE 6

A copper-containing composition was prepared in the same manner as in Example 4 except that 6.7 parts of a phenol resin varnish (solid concentration: 60%) was used as the resin binder. The composition was evaluated in the same manner as in Example 4. The results are shown in Table 1.

EXAMPLES 7 to 10

Copper-containing compositions were prepared in the same manner as in Example 1 except that benzoin in Example 1 was replaced by the respective thiols identified in Table 1. The compositions were evaluated in the same manner as in Example 1. The results are shown in Table 1.

EXAMPLE 11

A copper-containing composition was prepared in the same manner as in Example 1 except that phenothiazine was used instead of benzoin. The composition was evaluated in the same manner as in Example 1. The results are shown in Table 1.

EXAMPLES 12 and 13

Copper-containing compositions were prepared in the same manner as in Example 1 except that benzoin in Example 1 was replaced by the respective mixtures of two additive agents identified in Table 1. The compositions were evaluated. The results are shown in Table 1.

EXAMPLE 14

A copper-containing composition was prepared in the same manner as in Example 1 except that 1 part of tall oil (resin acid: 34.7%, acid value: 181) was used instead of benzoin. The composition was evaluated in the same manner as in Example 1. The results are shown in Table 1.

EXAMPLES 15 and 16

Copper-containing compositions were prepared in the same manner as in Example 14 except that rosin (softening point: 77° C., acid value: 168), or pentaerythritol-esterified rosin (softening point: 79° C., acid value: 45) was used instead of tall oil. The compositions were evaluated. The results are shown in Table 1.

EXAMPLE 17

A copper-containing composition was prepared in the same manner as in Example 14 except that oleic acid amide was used instead of tall oil. The composition was evaluated. The results are shown in Table 1.

EXAMPLE 18

A copper-containing composition was prepared in the same manner as in Example 14 except that lauric acid amide was used instead of tall oil. The composition was evaluated. The results are shown in Table 1.

EXAMPLE 19

A copper-containing composition was prepared in the same manner as in Example 14 except that 6.7 parts of a phenol resin varnish (solid concentration: 60%) was used as the resin binder. The composition was evaluated. The results are shown in Table 1.

EXAMPLE 20

A copper-containing composition was prepared in the same manner as in Example 14 except that 0.75 part of tall oil and 0.75 part of oleic acid amide were used instead of tall oil. The composition was evaluated. The results are shown in Table 1.

EXAMPLE 21

A copper-containing composition was prepared in the same manner as in Example 1 except that 1.5 parts of o-aminophenol was used instead of benzoin. The composition was evaluated. The results are shown in Table 1.

COMPARATIVE EXAMPLE 4

A copper-containing composition was prepared in the same manner as in Example 21 except that 1.5 parts of p-aminophenol was used instead of o-aminophenol. The composition was evaluated.

The specific resistance of the cured coating film was $1.2 \times 10^{-2}$ Ωcm. The composition had a resistance higher by about 60 times than the resistance in the case of o-aminophenol. Thus, the resistance-reducing effect of o-aminophenol was found to be extremely high.

EXAMPLE 22

A copper-containing composition was prepared in the same manner as in Example 21 except that 1.0 part of 2-amino-4-nitrophenol was used instead of o-aminophenol. The composition was evaluated. The results are shown in Table 1.

EXAMPLE 23

A copper-containing composition was prepared in the same manner as in Example 21 except that 1.0 part of 2-amino-4-methylphenol was used instead of o-aminophenol. The composition was evaluated. The results are shown in Table 1.

EXAMPLE 24

A copper-containing composition was prepared in the same manner as in Example 21 except that 1.0 part of 2'2-pyridyl was used instead of o-aminophenol. The composition was evaluated. The results are shown in Table 1.

EXAMPLE 25

A copper-containing composition was prepared in the same manner as in Example 21 except that a phenol resin varnish was used as the resin binder. The composition was evaluated. The results are shown in Table 1.

EXAMPLE 26

A copper-containing composition was prepared in the same manner as in Example 21 except that 1.5 parts of 2'2-diquinolyl was used instead of o-aminophenol. The composition was evaluated. The results are shown in Table 1.

EXAMPLE 27

A copper-containing composition was prepared in the same manner as in Example 21 except that 1.0 part of o-aminophenol and 0.6 part of 2,2'-dipyridyl were used instead of 1.5 parts of o-aminophenol. The composition was evaluated. The results are shown in Table 1.

TABLE 1

| | Additive | Amount (parts) | Resistance (Ω) | Specific resistance (Ω cm) | Skinning (Stored at about 10° C.) | Storage under constant temperature and humidity condition* |
|---|---|---|---|---|---|---|
| Example 1 | Benzoin | 1.5 | 10.8 | $3.0 \times 10^{-4}$ | No change observed after one month | No change |
| Example 2 | Dihydroxyacetone | 0.8 | 17.0 | $4.7 \times 10^{-4}$ | No change observed after one month | " |
| Example 3 | Acetoin | 1.5 | 20.1 | $5.8 \times 10^{-4}$ | No change observed after one month | " |
| Example 4 | Ninhydrin | 1.5 | 5.0 | $1.3 \times 10^{-4}$ | No change observed after one month | " |
| Example 5 | Ninhydrin | 0.8 | 10.4 | $2.9 \times 10^{-4}$ | No change observed after one month | " |
| Example 6 | Ninhydrin | 1.5 | 7.6 | $2.2 \times 10^{-4}$ | No change observed after one month | " |
| Example 7 | Laurylmercaptan | 0.8 | 8.8 | $2.7 \times 10^{-4}$ | No change observed after one month | " |
| Example 8 | n-Butylmercaptan | 1.5 | 24.7 | $7.0 \times 10^{-4}$ | No change observed after one month | " |
| Example 9 | Phenylmercaptan | 1.5 | 19.1 | $5.1 \times 10^{-4}$ | No change observed after one month | " |
| Example 10 | 2-Mercaptonaphthalene | 1.5 | 21.0 | $6.5 \times 10^{-4}$ | No change observed after one month | " |
| Example 11 | Phenothiazine | 1.5 | 21.1 | $5.8 \times 10^{-4}$ | No change observed after one month | " |
| Example 12 | Benzoin Laurylmercaptan | 1.5 1.6 | 12.2 | $3.7 \times 10^{-4}$ | No change observed after one month | " |
| Example 13 | Ninhydrin 2-Mercaptonaphthalene | 0.8 1.6 | 14.6 | $4.2 \times 10^{-4}$ | No change observed after one month | " |
| Example 14 | Tall oil | 1.0 | 3.5 | $1.0 \times 10^{-4}$ | No change observed after one month | " |
| Example 15 | Rosin | 1.0 | 16.0 | $4.7 \times 10^{-4}$ | No change observed after one month | |

TABLE 1-continued

|  | Additive | Amount (parts) | Resistance ($\Omega$) | Specific resistance ($\Omega$ cm) | Skinning (Stored at about 10° C.) | Storage under constant temperature and humidity condition* |
|---|---|---|---|---|---|---|
| Example 16 | Pentaerythritol esterified rosin | 1.0 | 22.0 | $6.1 \times 10^{-4}$ | No change observed after one month | " |
| Example 17 | Oleic acid amide | 1.0 | 9.4 | $2.6 \times 10^{-4}$ | No change observed after one month | " |
| Example 18 | Lauric acid amide | 1.5 | 10.9 | $2.9 \times 10^{-4}$ | No change observed after one month | " |
| Example 19 | Tall oil | 1.0 | 9.7 | $2.5 \times 10^{-4}$ | No change observed after one month | " |
| Example 20 | Lauric acid amide Tall oil | 0.75 0.75 | 7.8 | $2.1 \times 10^{-4}$ | No change observed after one month | |
| Example 21 | o-Aminophenol | 1.5 | 6.9 | $2.0 \times 10^{-4}$ | No change observed after one month | " |
| Example 22 | 2-Amino-4-nitrophenol | 1.0 | 11.4 | $3.1 \times 10^{-4}$ | No change observed after one month | " |
| Example 23 | 2-Amino-4-methylphenol | 1.0 | 9.8 | $2.8 \times 10^{-4}$ | No change observed after one month | " |
| Example 24 | 2,2'-Dipyridyl | 1.0 | 3.8 | $1.1 \times 10^{-4}$ | No change observed after one month | " |
| Example 25 | 2,2'-Dipyridyl | 1.0 | 8.3 | $2.5 \times 10^{-4}$ | No change observed after one month | " |
| Example 26 | 2,2'-Diquinolyl | 1.5 | 8.3 | $2.2 \times 10^{-4}$ | No change observed after one month | " |
| Example 27 | o-Aminophenol 2,2'-Dipyridyl | 1.0 0.6 | 8.3 | $2.3 \times 10^{-4}$ | No change observed after one month | — |
| Comparative Example 1 | Phosphorous acid | 1.5 | 269 | $8.0 \times 10^{-3}$ | Skinning observed after one day | Bluish white spots observed after two days |
| Comparative Example 2-1 | Anthracene | 0.34 | 68.1 | $2.0 \times 10^{-3}$ | No change observed after one month | No change |
| Comparative Example 2-2 | Anthracene-9-carboxylic acid | 0.34 | 62.5 | $1.7 \times 10^{-3}$ | Skinning observed after two days | " |
| Comparative Example 3 | Pyrocatechol | 1.5 | 45.0 | $1.2 \times 10^{-3}$ | No change observed after one day | " |

*Change in the outer appearance when the composition was left in a constant temperature and humidity chamber at 60° C. under a relative humidity of 95% for 200 hrs.

We claim:

1. An electrically conductive composition comprising 100 parts by weight of a copper powder, from 2 to 100 parts by weight of a resin binder, and from 0.1 to 30 parts by weight of an additive agent, wherein the additive agent is at least one compound selected from the group consisting of α-ketols, aliphatic and aromatic thiols, thiodiarylamines, tall oils, rosins, rosin esters, higher fatty acid amides, o-aminophenols, 2,2'-dipyridyls, and 2,2'-diquinolyls.

2. The composition according to claim 1, which comprises 100 parts by weight of the copper powder, from 7 to 45 parts by weight of the resin binder, and from 0.5 to 10 parts by weight of the additive agent.

3. The composition according to claim 1, wherein the additive agent is ninhydrin.

4. The composition according to claim 1, wherein the additive agent is 2,2'-dipyridyl.

5. The composition of claim 1 wherein the α-ketols are selected from the group consisting of acetol, acetoin, dihydroxyacetone, phenacyl alcohol, benzoin, and ninhydrin.

6. The composition of claim 1 wherein the aliphatic and aromatic thiols are selected from the group consisting of a compound of the formula RSH, wherein R is alkyl, cycloalkyl, alkenyl, cycloalkenyl, aralkyl or allyl.

7. The composition of claim 6 wherein the aliphatic thiols are selected from the group consisting of n-propylmercaptan, n-butylmercaptan, allylmercaptan, octylmercaptan, laurylmercaptan, stearylmercaptan, olemylercaptan, linolenylmercaptan, cyclohexylmercaptan and benzylmercaptan.

8. The composition of claim 6 wherein the aromatic thiols are selected from the group consisting of thiophenol, 1-mercaptonaphthalene, 2-mercaptoanthracene, 3-mercaptophenanthrene, 4-mercaptobiphenyl and 2-mercaptopyridine; wherein the aromatic rings are substituted by H, alkyl, hydroxyl, carboxyl, sulfone, nitro, or halogen.

9. The composition of claim 1 wherein the thiodiarylamines are selected from the group consisting of thiodiphenylamine and thiodinaphthylamine.

10. The composition of claim 1 wherein the tall oils are recovered as by-products during the preparation of conifer kraft pulp, and contain
    resin acids composed mainly of abietic acid and its isomer, or
    an aliphatic acid selected from the group consisting of oleic acid or linoleic acid.

11. The composition of claim 1 wherein the rosins are selected from the group consisting of
    gum rosin obtained by distilling turpentine oil from pine tree colophony,
    wood rosin extracted from pine root chips with a solvent,
    tall rosin precision distilled from crude tall oil,
    a disproportionated rosin obtained by heating rosin at high temperature,
    a hydrogenated rosin obtained by hydrogenating rosin in the presence of a noble metal catalyst to eliminate the conjugated double bond,
    a polymerized rosin obtained by heating rosin in the presence of an acidic catalyst,
    a rosin obtained by a Diels-Alder reaction of the rosins thereof with maleic anhydride, fumaric acid, acrylic acid or cyclopentadiene, and alcoholic products thereof.

12. The composition of claim 1 wherein the rosin esters are selected from the group consisting of those obtainable by reacting abietic acid or its isomer as the main components of rosin, with a monohydric or polyhydric alcohol at a high temperature.

13. The composition of claim 1, wherein the rosin esters are selected from the group consisting of methyl-esterified rosin, monoethylene glycol-esterified rosin, diethylene glycol-esterified rosin, glycerin-esterified rosin, pentaerythritol-esterified rosin, and rosin esters obtained by a Diels-Alder reaction of the rosin esters thereof with maleic anhydride, fumaric acid, acrylic acid or cyclopentadiene and alcoholic products thereof.

14. The composition of claim 1 wherein the higher fatty acid amides are selected from the group consisting of amides derived from ($C_{10}$–$C_{24}$)aliphatic acids.

15. The composition of claim 14 wherein the aliphatic acids are selected from the group consisting of lauric acid amide, myristic acid amide, palmitic acid amide, stearic acid amide, oleic acid amide, linolic acid amide and brassidic acid amide.

* * * * *